United States Patent
Oon et al.

(10) Patent No.: US 7,566,159 B2
(45) Date of Patent: Jul. 28, 2009

(54) SIDE-EMITTING LED PACKAGE WITH IMPROVED HEAT DISSIPATION

(75) Inventors: Siang Ling Oon, Penang (MY); Thye Linn Mok, Penang (MY); Kha Yan Loon, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 133 days.

(21) Appl. No.: 11/755,982

(22) Filed: May 31, 2007

(65) Prior Publication Data

US 2008/0298081 A1    Dec. 4, 2008

(51) Int. Cl.
    *F21V 7/04*    (2006.01)
(52) U.S. Cl. .................. 362/612; 362/613; 257/98; 257/99; 257/676
(58) Field of Classification Search .............. 362/611, 362/630, 612, 800; 257/98–100, 103
    See application file for complete search history.

(56) References Cited

U.S. PATENT DOCUMENTS

| | | | |
|---|---|---|---|
| 6,712,529 B2 * | 3/2004 | Horio | 385/92 |
| 6,953,952 B2 * | 10/2005 | Asakawa | 257/103 |
| 7,393,122 B2 * | 7/2008 | Tsuzuki et al. | 362/304 |
| 2007/0164408 A1 * | 7/2007 | Yeh et al. | 257/676 |
| 2008/0173892 A1 * | 7/2008 | Chen | 257/99 |
| 2008/0179619 A1 * | 7/2008 | Wu et al. | 257/99 |

\* cited by examiner

*Primary Examiner*—Sandra L O'Shea
*Assistant Examiner*—Evan Dzierzynski

(57) ABSTRACT

A light source and a method for making the same are disclosed. The light source includes a lead frame, an integrated circuit chip and a body. The lead frame has first and second sections. The first section includes a lateral portion, a chip mounting area and a first extension. The integrated circuit chip is bonded to the first section in the chip mounting area and is in thermal contact with the chip mounting area. The body has top, bottom, and side surfaces. The first extension is bent to provide a heat path from the chip mounting area to the side surface, a surface of the first extension that is not in contact with the side surface forming a first planar bonding surface. The heat path has less thermal resistance than a heat path through the lateral portion.

20 Claims, 5 Drawing Sheets

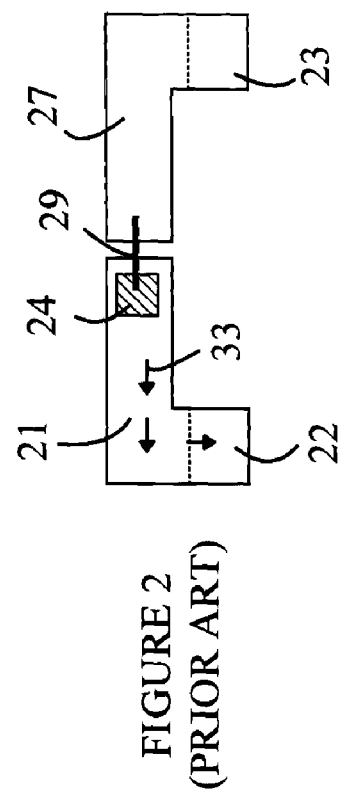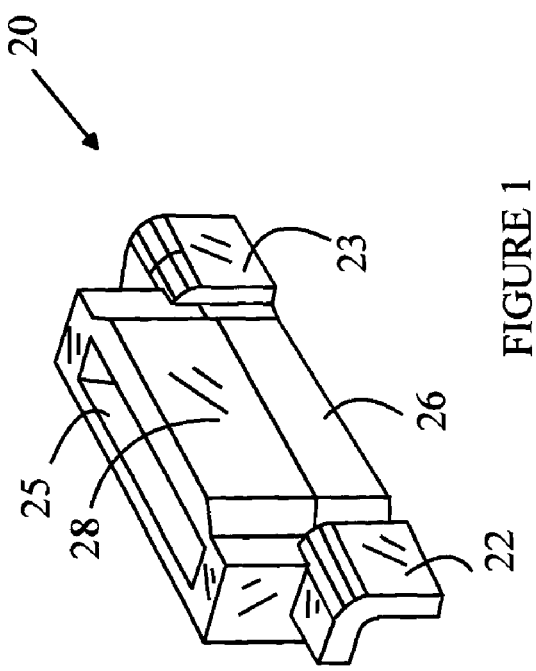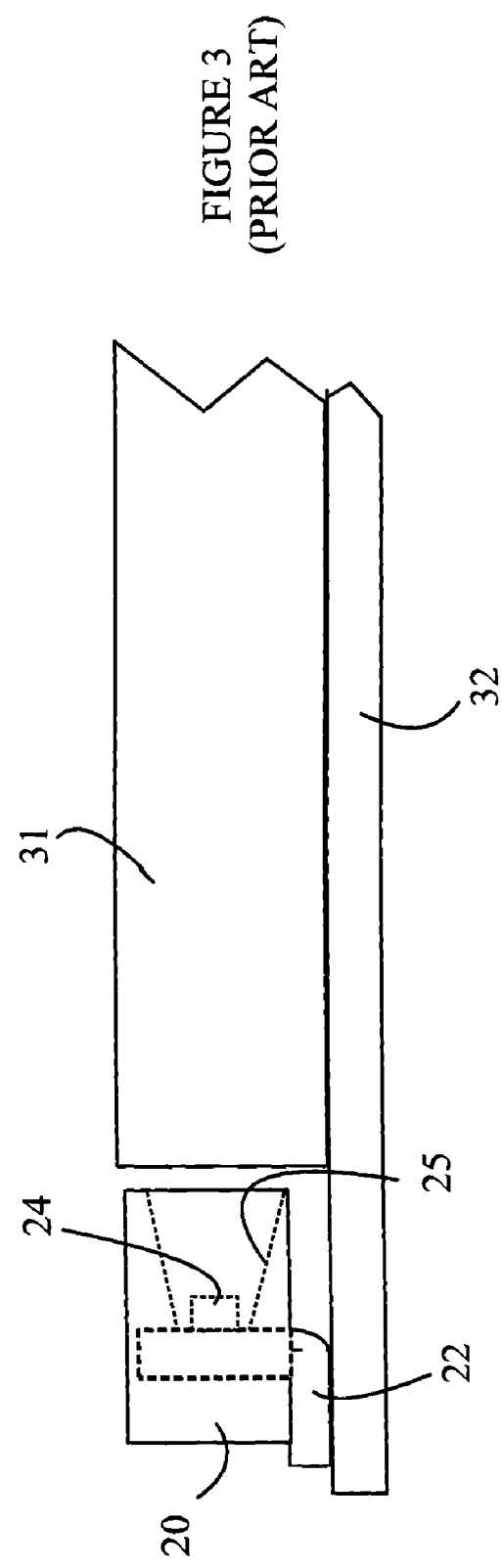

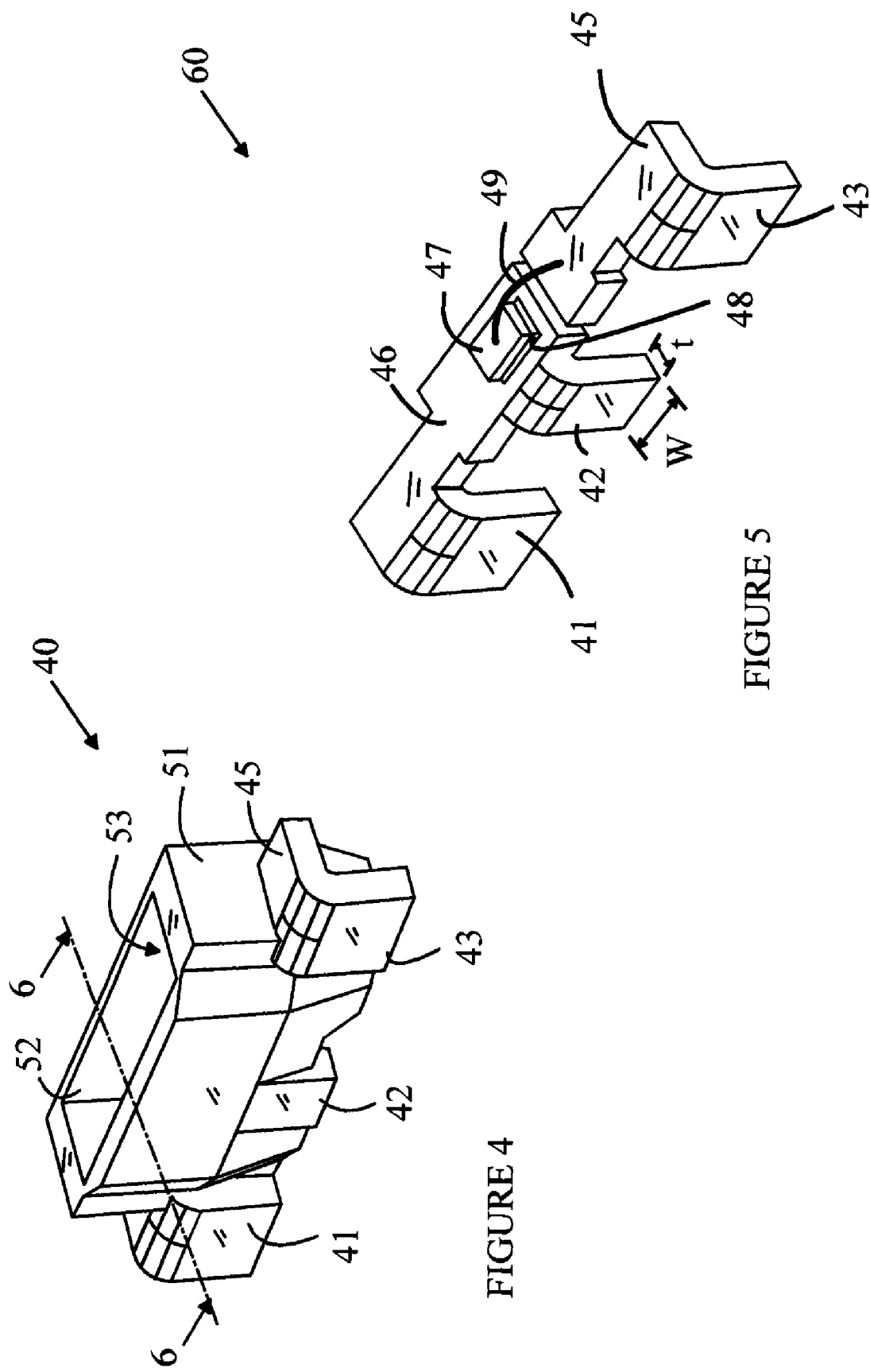

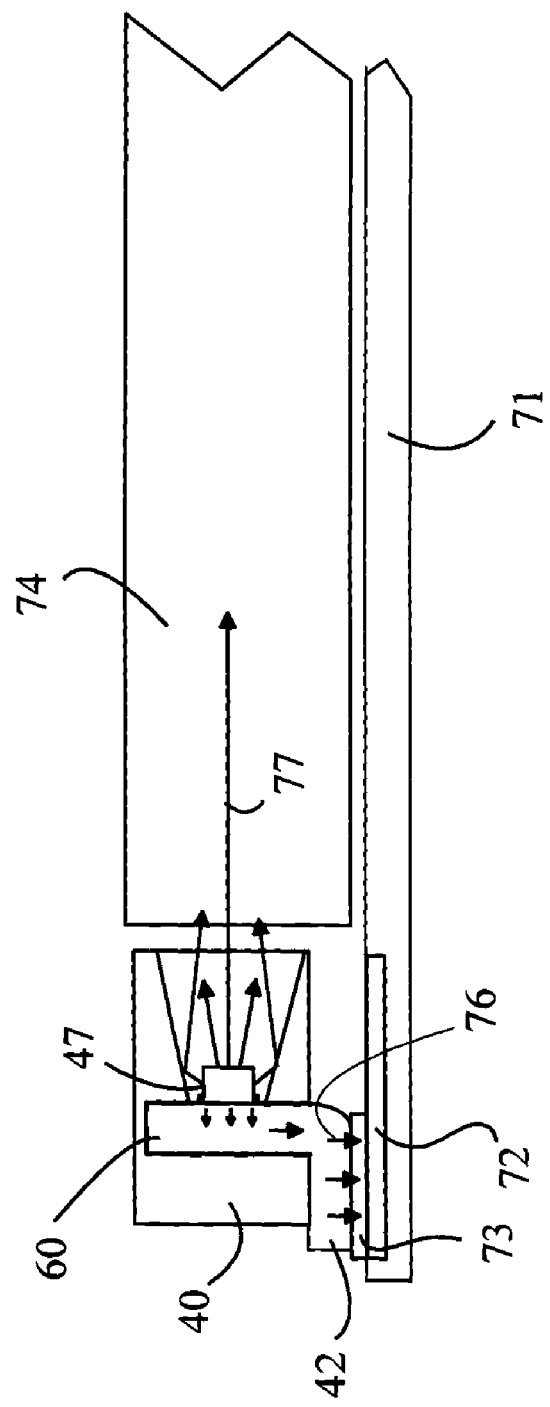

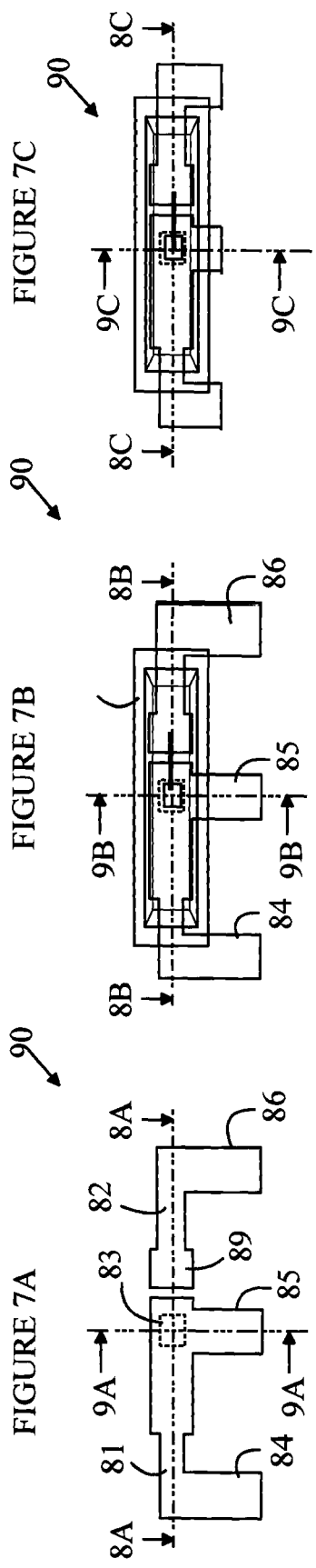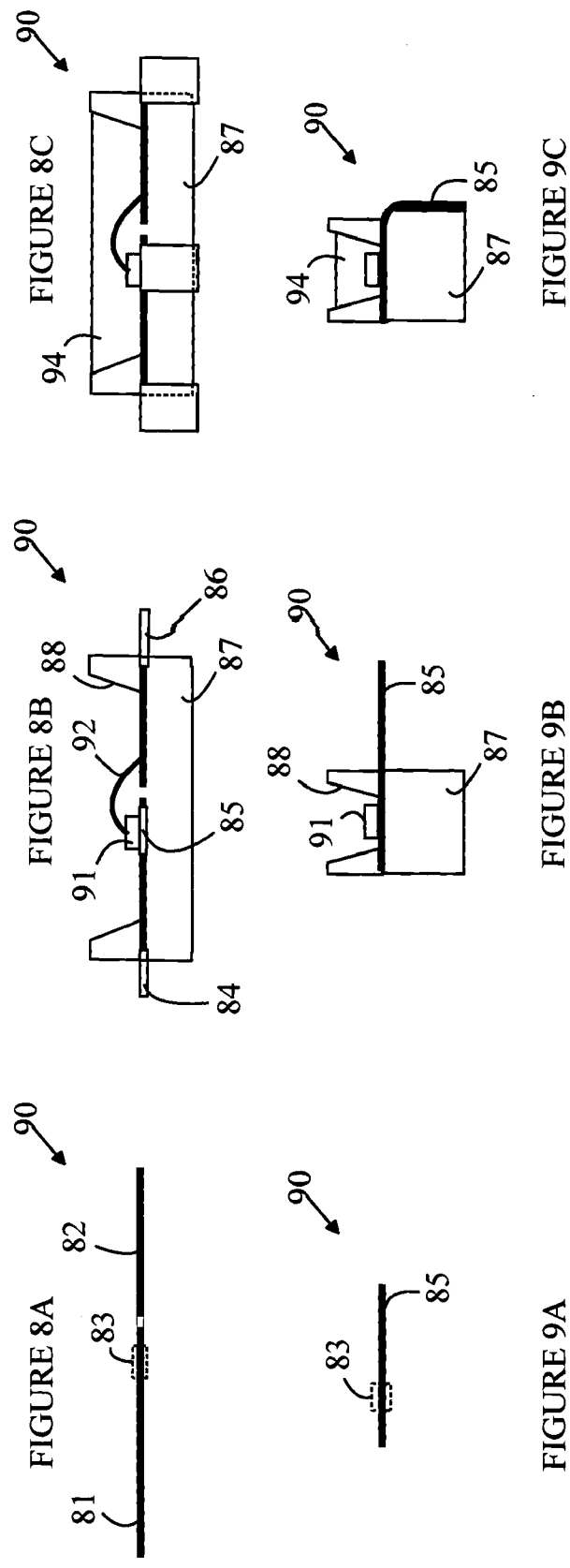

SIDE-EMITTING LED PACKAGE WITH IMPROVED HEAT DISSIPATION

BACKGROUND OF THE INVENTION

Light-emitting diodes (LEDs) are attractive candidates for replacing conventional light sources such as incandescent bulbs and fluorescent tubes. LEDs have significantly greater energy conversion efficiencies than incandescent bulbs and, in some cases, higher energy conversion efficiencies than fluorescent tubes. Furthermore, the conversion efficiencies of LEDs are steadily improving over time, and hence, LEDs will provide significant energy savings in the not too distant future.

In addition, LEDs have lifetimes that are much greater than the lifetime of either fluorescent lights or incandescent bulbs. This advantage is particularly important in applications in which the cost of changing a bulb or fluorescent tube is high. Automobile taillights and traffic signal lights are already being converted to LED-based lighting systems to take advantage of this aspect of LEDs.

Finally, LEDs are "point sources", and hence, are better suited than fluorescent tubes for lighting applications in which light must be collimated or focused. One such class of applications involves the illumination of a planar light pipe that is used to illuminate a two-dimensional device such as a Liquid crystal display (LCD) or a switch panel. The light pipe is typically a thin sheet of plastic having one or more edges through which light is injected from a light source. In handheld devices such as cellular telephones or PDAs, the thickness of the light pipe is often less than a few millimeters. Hence, the small size of an LED is particularly important in such applications.

The high light conversion efficiencies that make LEDs attractive as replacement candidates depend on providing an environment in which the heat generated by the LED is efficiently removed so that the LED is not subjected to high temperatures. For the purposes of this discussion, the light conversion efficiency of a light source is defined to be the amount of light generated per watt of electricity consumed by the light source. The light conversion efficiency of the LEDs that are currently available decreases rapidly with increasing temperature. In addition to reducing the light conversion efficiency, heat also shortens the lifetime of the LED and can lead to premature total device failure. While the light conversion efficiencies of LEDs are large compared to incandescent light sources, the majority of the power applied to the LED is still converted to heat.

LEDs also age with time. As a result of the aging, the amount of light that is produced for a given current through the LED decreases. In light sources that use LEDs that emit light in different wavelength bands to generate illumination that is perceived as having a particular color, the aging effects lead to a color shift over time in the perceived color. In many applications, the color shift is more objectionable than the decrease in intensity of the light source. The rate at which LEDs age depends on the operating temperature of the LEDs, higher operating temperatures leading to more rapid aging.

Accordingly, packaging arrangements for LED dies must provide an efficient path for removing heat from the dies. Lead frame packages are attractive from a cost point of view. However, lead frame packages that provide sufficient heat dissipation are not available for high power dies. These packages typically rely on moving heat from the LED to an outside heat-dissipating surface since the surface area of the LED package is too small to dissipate heat to the air surrounding the LED. Typically, the heat is transferred to the core of a printed circuit board on which the LED is mounted. In a typical LED lead frame package, the LED is mounted on the internal portion of one of the leads and the heat is moved over that lead to the core of the printed circuit board. Unfortunately, the lead heat path tends to have too high of a thermal resistance, and hence, the die must run at a substantially elevated temperature to force the heat through the lead.

SUMMARY OF THE INVENTION

The present invention includes a light source and a method for making the same. The light source includes a lead frame, an integrated circuit chip and a body. The lead frame has first and second sections. The first section includes a lateral portion, a chip mounting area and a first extension. The integrated circuit chip is bonded to the first section in the chip mounting area and is in thermal contact with the chip mounting area. The body has top, bottom, and side surfaces. The first extension is bent to provide a heat path from the chip mounting area to the side surface, a surface of the first extension that is not in contact with the side surface forming a first planar bonding surface. The heat path has less thermal resistance than a heat path through the lateral portion. The integrated circuit chip includes a light emitting element that is powered through first and second contacts. The first contact is on a surface of the chip that is not bonded to the chip mounting area and is electrically connected to the second section. In one aspect of the invention, the second section includes a second extension, the second extension being bent to provide a second planar bonding surface. The first and second planar bonding surfaces are substantially coplanar. In another aspect of the invention, the body layer includes an opening through which the chip mounting area and a portion of the second section can be accessed. The opening can include reflective walls that form a reflector for redirecting light leaving the chip in a direction that would not allow the light to pass through the opening such that the light exits the opening.

BRIEF DESCRIPTION OF THE DRAWINGS

FIG. 1 is a perspective view of prior art light source 20.

FIG. 2 is a top view of the lead frame used in prior art light source 20.

FIG. 3 is a cross-sectional view of prior art light source 20 mounted to provide illumination of a light pipe.

FIGS. 4 and 5 illustrate one embodiment of a light source according to the present invention.

FIG. 6 is a cross-sectional view of light source 40 through line 6-6 shown in FIG. 4.

FIGS. 7A-7C are a top view of light source 90 at three stages in the fabrication.

FIGS. 8A-8C are cross-sectional views of light source 90 through lines 8A-8A, 8B-8B, and 8C-8C, respectively.

FIGS. 9A-9C are cross-sectional views of light source 90 through lines 9A-9A, 9B-9B, and 9C-9C, respectively.

DETAILED DESCRIPTION OF THE PREFERRED EMBODIMENTS OF THE INVENTION

Figure 10:
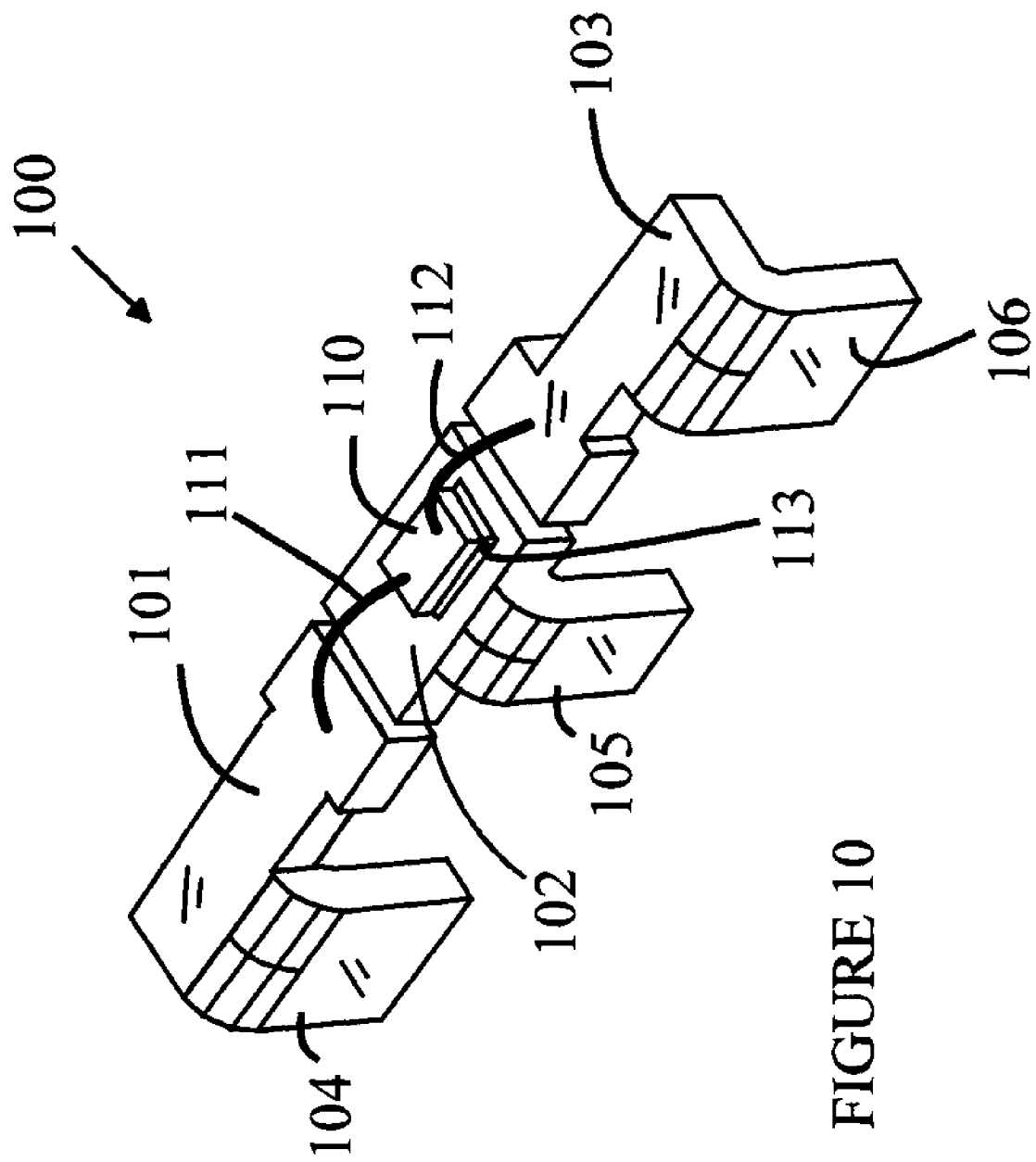
FIG. 10 is a perspective view of a lead frame 100 that can be used in a light source according to another embodiment of the present invention.

The manner in which the present invention provides its advantages can be more easily understood with reference to FIGS. 1-3, which illustrate a prior art side-emitting packaged LED light source. FIG. 1 is a perspective view of light source 20 and FIG. 2 is a top view of the lead frame used in light source 20. FIG. 3 is a cross-sectional view of light source 20 mounted to provide illumination of a light pipe. Light source 20 includes an LED 24 that is mounted on lead 21 of the lead frame shown in FIG. 2. LED 24 includes first and second contacts that are used to power LED 24. The first contact is on the bottom surface of LED 24 and is connected electrically to lead 21. The second contact is on the top surface of LED 24 and is connected to lead 27 by a wire bond 29. LED 24 is bonded to lead 21 by an adhesive that is both thermally and electrically conductive, so that the heat generated in LED 24 is transferred to lead 21.

The lead frame is encapsulated in a body 26 from which the portion of the leads shown at 22 and 23 extend. The upper portion of body 26 includes a reflector 25 that redirects light leaving LED 24 in a sideways direction to a direction that is within the cone of angles into which light from the top surface of LED 24 is emitted. Portion 28 can be provided as part of the same molding operation used to form the portion of the body shown at 26. Alternatively, portion 28 can be formed separately and attached after the portion is formed.

Refer now to FIG. 3. Light source 20 is designed to be mounted on a printed circuit board such as printed circuit board 32 such that light leaves light source 20 in a direction that is parallel to the surface of printed circuit board 32. Light source 20 is typically mounted on printed circuit board 32 by soldering the portions of leads 21 and 27 shown at 22 and 23 to traces on the surface of printed circuit board 32. This arrangement is well suited for injecting light from light source 20 into a light pipe 31 that is also mounted on printed circuit board 32.

The heat generated in LED 24 is conducted through lead 21 to region 22. The mounting pad on printed circuit board 32 to which region 22 is soldered is also in thermal contact with the core of printed circuit board 32. Hence, the heat is transferred to the core of the printed circuit board, which either has sufficient area to dissipate the heat or is attached to a structure that dissipates the heat. Unfortunately, the heat path 33 from LED 24 to region 22 has a substantial thermal resistance, and hence, the temperature of LED 24 must be significantly above the temperature of region 22 to move sufficient heat in many applications.

Refer now to FIGS. 4 and 5, which illustrate one embodiment of a light source according to the present invention. Light source 40 is similar to light source 20 discussed above in that light source 40 includes a body 51 that is molded around a lead frame 60. The body can be molded from a large variety of electrically insulating materials such as an epoxy or silicone. Body 51 includes an opening 53 through which light generated by LED 47 exits light source 40. Body 51 also includes a reflector 52 that redirects light from LED 47, that would otherwise not exit body 51 within the correct cone of angles, such that the reflected light exits opening 53 within a cone of angles that includes the light emitted from the top surface of LED 47.

Lead frame 60 includes a first lead 46 on which die 47 that includes the LED is mounted. Die 47 has first and second contacts that are used to power the LED. The first contact is on the bottom of die 47 and the second contact is on the top of die 47. Die 47 is bonded to lead 46 by a layer of adhesive 48 that is both electrically and thermally conductive. The top contact on die 47 is connected to lead 45 by wire bond 49.

Lead 46 has first and section sections 41 and 42, respectively, that extend outside of body 51 and that are bent to provide bonding pads for bonding light source 40 to a planar surface. Similarly, lead 45 has a section 43 that extends outside of body 51 and is bent to provide a bonding pad for bonding light source 40 to the planar surface. Sections 41 and 43 provide power connections for powering die 47.

Section 42 provides a heat conduction path that has substantially less thermal resistance than the path from die 47 through section 41. When section 42 is bonded to a heat-dissipating pad on a printed circuit board, the heat conduction path from die 47 to the heat-dissipating pad is approximately equal to the thickness, t, of section 42. Since the portion of lead 46 on which die 47 is mounted is substantially wider than the width, W, of section 42, the thermal resistance of the path through section 42 is determined primarily by the thickness of the lead frame. Accordingly, a heat conduction path having a thermal resistance that is substantially less than the path through section 41 is provided.

In the above referenced embodiment, t is between 0.1 and 0.8 mm, and W is set to be between one and two times the width of the die, i.e., 0.45 to 0.9 mm. The lead frame can be constructed from a number of materials including copper, copper alloy, brass, leaded brass, tin brass and mild steel.

Refer now to FIG. 6, which is a cross-sectional view of light source 40 through line 6-6 shown in FIG. 4. In FIG. 6, light source 40 is attached to a printed circuit board 71 that includes a core 72 that is connected to a heat dissipating structure. Lead frame section 42 is bonded to core 72 by a layer of heat conducting bonding material 73 such as solder or heat conducting epoxy. To simplify the drawing, the heat dissipating structure is not shown in the drawing. Hence, the heat from LED 47, which is indicated by the arrows shown at 76 in the figure, is efficiently transferred to core 72 through lead frame section 42.

Lead frame section 42 is positioned on the outer surface of light source 40 such that light source 40 can be mounted on printed circuit board 71 so that light leaving light source 40 leaves in directions that are more or less parallel to the surface of printed circuit board 71. Hence, light source 40 is particularly well adapted for illuminating the edge of a light pipe such as light pipe 74. The range of angles depends on the characteristics of the die on which LED 47 is constructed and on the shape of reflector 52. In general, reflector 52 and LED 47 define a bundle of angles about a direction 77 that is substantially parallel to the surface of printed circuit board 71. The distribution of light rays within this bundle depends on the specific shape of reflector 52 and is chosen to provide the emission profile required by the particular application.

Refer now to FIGS. 7-9, which illustrate one embodiment of a method for fabricating a light source according to the present invention. FIGS. 7A-7C are a top view of light source 90 at three stages in the fabrication. FIGS. 8A-8C are cross-sectional views through lines 8A-8A, 8B-8B, and 8C-8C, respectively. FIGS. 9A-9C are cross-sectional views through lines 9A-9A, 9B-9B, and 9C-9C, respectively. It should be understood that a number of light sources are fabricated from a lead frame sheet. To simplify the drawings and discussion, only the portion of the lead frame sheet that is used to fabricate light source 90 is shown in the drawings.

Referring to FIGS. 7A-9A, the process starts with a lead frame having lead sections 81 and 82. Lead frame section 81 has a die mounting area 83 and two extensions shown at 84 and 85. Lead frame section 82 has an extension 86 and a wire bond area 89. Refer now to FIGS. 7B-9B, which illustrate light source 90 after body 87 has been molded around portions of the lead frame. Body 87 includes a cavity having sides 88 that form the reflector discussed above. After body 87 has been molded, a die 91 having the LED is bonded to die bonding area 83 and connected to wire bond area 89 by a wire bond 92. Extensions 84-86 remain outside of body 87. Finally, referring to FIGS. 7C-9C, the extensions are bent downward such that extensions 84-86 are now adjacent to the side surface of body 85 and the surfaces of extensions 84-86 that are not adjacent to the side wall of body 87 lie substantially in the same plane such that all three extensions will contact a planar surface such that the surfaces can be bonded to the planar surface when placed adjacent to that planar surface. In one embodiment, the reflector is filled with a material 94 that is transparent to the light generated by die 91. The transparent material can be an epoxy or a silicone.

Refer again to FIG. 5. In principle, extensions 41 and 42 could be combined to form one wide lead. However, there is a limit on the improvement in heat transfer that can be provided by increasing the width, W, of extension 42. When the thermal resistance through extension 42 becomes small compared to the thermal resistance between die 47 and lead frame section 46, a further increase in W will not provide significant improvement. However, the increased width would present problems in terms of bending the lead during fabrication.

The above-described embodiments utilize an LED having one power contact on the bottom surface of the die and the other power contact on the top surface of the die. However, embodiments in which both power contacts are on the top surface of the die can also be constructed. Refer now to FIG. 10, which is a perspective view of a lead frame 100 that can be used in a light source according to another embodiment of the present invention. Lead frame 100 has three lead frame sections shown at 101-103. Section 102 includes the die mounting area in which a die 110 is bonded to the surface of lead frame section 102 by a layer of a bonding agent 113. Section 102 includes a section 105 that provides the heat transfer path for removing heat from die 110. The power contacts on die 110 are on the top surface of the die and are connected to lead frame sections 101 and 103, respectively, by wire bonds 111 and 112.

Since extensions 104 and 106 provide the electrical connections to die 110, extension 105 does not need to make electrical connections. Accordingly, the bond between die 110 and LED frame section 102 can be electrically insulating as long as the thermal resistance of the bond is low. This arrangement is useful when the light source is part of an assembly in which the heat-dissipating surface cannot function as a common electrical contact for the various devices that are dissipating heat to the printed circuit board core.

The above-described embodiments of the present invention have utilized LEDs as the light generating element in the light source. However, embodiments based on other light generating elements could be constructed. In this regard, a light source consisting of a VCSEL could be advantageously employed.

Various modifications to the present invention will become apparent to those skilled in the art from the foregoing description and accompanying drawings. Accordingly, the present invention is to be limited solely by the scope of the following claims.

What is claimed is:

1. A light source comprising:
   a lead frame having first and second sections with a gap therebetween, said first section comprising a chip mounting area, a first extension positioned adjacent to said chip mounting area, and a second extension spaced away from said first extension, wherein said second section comprises a third extension spaced away from said first extension and said second extension, wherein said first extension is bent to provide a first planar bonding surface oriented along a plane, said second extension is bent to provide a second planar bonding surface oriented along said plane, and said third extension is bent to provide a third planar bonding surface oriented along said plane;
   an integrated circuit chip bonded to said first section in said chip mounting area and in thermal contact with said chip mounting area, wherein said first extension is proximally closer to said integrated circuit chip than said second extension; and
   a body having at least one opening through which at least said first extension, said second extension, and said third extension extend from said body, wherein said first extension is bent to provide a heat path from said chip mounting area through said first extension to said first planar bonding surface, and wherein said heat path has less thermal resistance than a heat path through said second extension.

2. The light source of claim 1 wherein said body comprises an epoxy or a silicone.

3. The light source of claim 1 wherein said lead frame comprises copper, copper alloy, brass, leaded brass, tin brass or mild steel.

4. The light source of claim 1 wherein said integrated circuit chip is characterized by a width and a length and wherein said first extension has a length along said bend greater than the maximum of said width and length.

5. The light source of claim 1 wherein said integrated circuit chip comprises a light emitting element that is powered through first and second contacts, said first contact being on a surface of said chip that is not bonded to said chip mounting area, said first contact being electrically connected to said second section.

6. The light source of claim 1 wherein said body includes an opening through which said chip mounting area and a portion of said second section can be accessed.

7. The light source of claim 6 wherein said opening comprises reflective walls that form a reflector for redirecting light through said opening.

8. The light source of claim 6 wherein said opening is filled with a medium that is transparent to light generated by said integrated circuit chip.

9. The light source of claim 1 further comprising a member having first and second bonding pads on a planar surface thereof, said first and second bonding surfaces being bonded to said first and second pads, wherein light leaves said integrated circuit chip in a direction that is parallel to said planar surface.

10. The light source of claim 9 further comprising a light pipe having an opening comprising a surface perpendicular to said planar surface, wherein said integrated circuit chip is positioned such that light leaving said integrated circuit chip enters said opening.

11. The light source of claim 1 wherein said integrated circuit chip comprises an LED.

12. The light source of claim 1 wherein said integrated circuit chip comprises a VCSEL.

13. A method for fabricating a light source having a light-emitting element on a die, said method comprising:
   providing a lead frame having first and second sections with a gap therebetween, said first section comprising a die mounting area, a first extension positioned adjacent to said die mounting area, and a second extension spaced away from said first extension, wherein said second section comprises a third extension spaced away from said first extension and said second extension;
   bonding said die to said first section in said die mounting area adjacent to said first extension such that said die is in thermal contact with said die mounting area;

molding a body around said lead frame, said body having at least one opening through which at least said first extension, said second extension, and said third extension extend from said body; and bending said first extension to provide a first planar bonding surface oriented along a plane and a heat path from said die mounting area through said first extension to said first planar bonding surface, wherein said heat path has less thermal resistance than a heat path through said second extension.

14. The method of claim 13 wherein said die comprises a light emitting element that is powered through first and second contacts, said first contact being on a surface of said die that is not bonded to said die mounting area, said method further comprising connecting said first contact to said second section by a wire bond.

15. The method of claim 14 further comprising providing a member having first and second bonding pads on a planar surface thereof, and bonding said first and second pads to said first and second bonding surfaces such that light leaves said die in a direction that is parallel to said planar surface.

16. The method of claim 15 further comprising providing a light pipe having an opening comprising a surface perpendicular to said planar surface, and positioning said die such that light leaving said die enters said opening.

17. The method of claim 13 wherein said body includes an opening through which said die mounting area and a portion of said second section can be accessed, said die being bonded to said die mounting area after said body is formed.

18. The method of claim 17 further comprising dispensing a medium that is transparent to light generated by said die into said opening.

19. The method of claim 18 wherein said medium comprises an epoxy or a silicone.

20. The method of claim 13 further comprising:

bending said second extension is bent to provide a second planar bonding surface oriented along said plane; and bending said third extension is to provide a third planar bonding surface oriented along said plane.

* * * * *